US010451673B2

(12) United States Patent
Kirihara et al.

(10) Patent No.: US 10,451,673 B2
(45) Date of Patent: Oct. 22, 2019

(54) ELECTRONIC COMPONENT CARRYING DEVICE AND ELECTRONIC COMPONENT INSPECTION DEVICE

(71) Applicant: Seiko Epson Corporation, Tokyo (JP)

(72) Inventors: Daisuke Kirihara, Azumino (JP); Masami Maeda, Suwa (JP)

(73) Assignee: Seiko Epson Corporation (JP)

( * ) Notice: Subject to any disclaimer, the term of this patent is extended or adjusted under 35 U.S.C. 154(b) by 66 days.

(21) Appl. No.: 15/561,761

(22) PCT Filed: Feb. 25, 2016

(86) PCT No.: PCT/JP2016/001028
§ 371 (c)(1),
(2) Date: Sep. 26, 2017

(87) PCT Pub. No.: WO2016/157710
PCT Pub. Date: Oct. 6, 2016

(65) Prior Publication Data
US 2018/0080982 A1 Mar. 22, 2018

(30) Foreign Application Priority Data

Mar. 30, 2015 (JP) ................................. 2015-068261

(51) Int. Cl.
*G01R 31/00* (2006.01)
*G01R 31/28* (2006.01)

(52) U.S. Cl.
CPC ..... *G01R 31/2891* (2013.01); *G01R 31/2881* (2013.01); *G01R 31/2862* (2013.01); *G01R 31/2893* (2013.01)

(58) Field of Classification Search
CPC ............ G01R 31/2891; G01R 31/2893; G01R 31/2881; G01R 31/2862; B65G 49/00
See application file for complete search history.

(56) References Cited

U.S. PATENT DOCUMENTS

| 6,437,593 B1 * | 8/2002 | Ito ...................... G01R 31/2874 324/750.03 |
| 2006/0214655 A1 * | 9/2006 | Ham ................... G01R 31/2893 324/757.04 |
| 2015/0247895 A1 | 9/2015 | Na et al. |

FOREIGN PATENT DOCUMENTS

| JP | 2001-228206 A | 8/2001 |
| JP | 2009-105339 A | 5/2009 |
| JP | 2012-132896 A | 7/2012 |
| JP | 2016-023939 A | 2/2016 |

* cited by examiner

*Primary Examiner* — Minh N Tang
(74) *Attorney, Agent, or Firm* — Harness, Dickey & Pierce, P.L.C.

(57) ABSTRACT

An inspection device includes: one chamber in which an IC device after an inspection can be arranged; another chamber in which the IC device after the inspection can be arranged and which is different from the one chamber; and a tray on which the electronic component after the inspection can be placed and which can move with the IC device from the one chamber to the another chamber. Also, the inspection device can detect at least one of humidity and temperature in the another chamber.

12 Claims, 8 Drawing Sheets

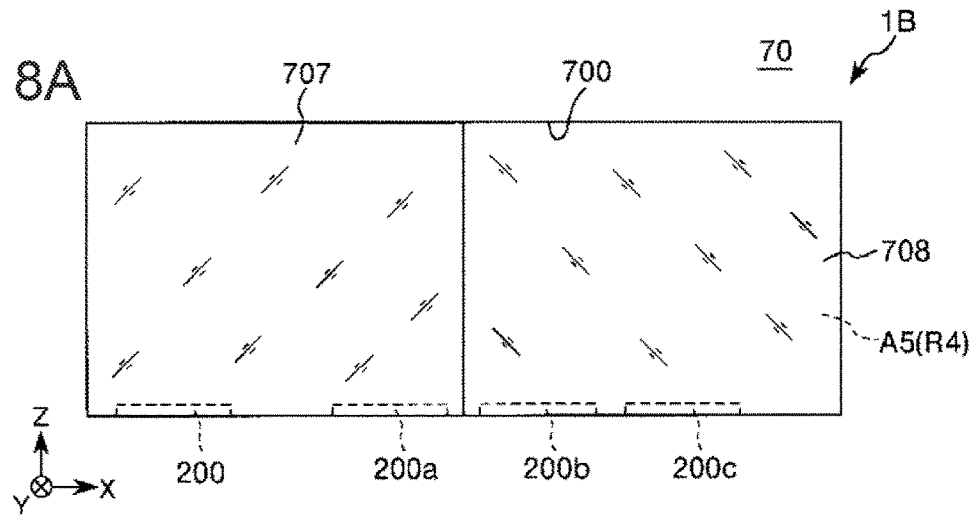
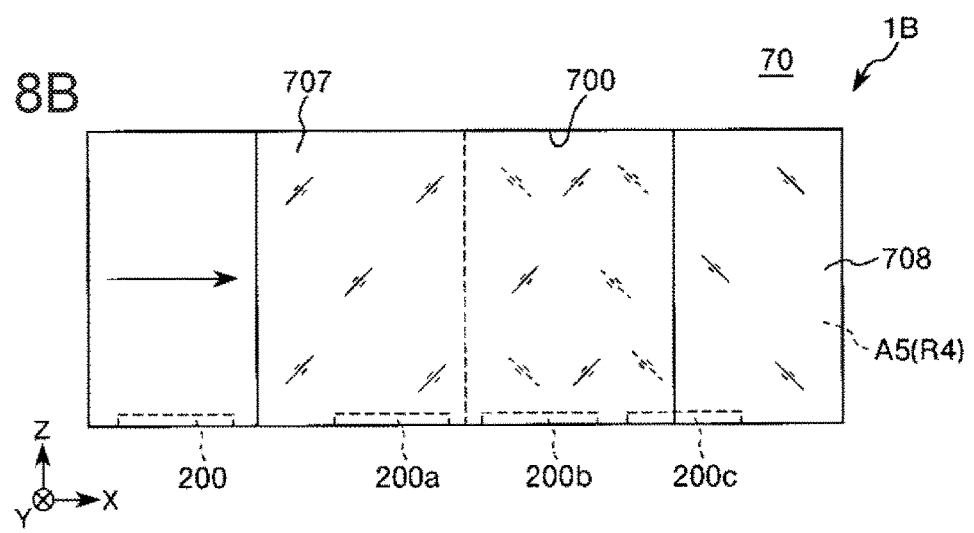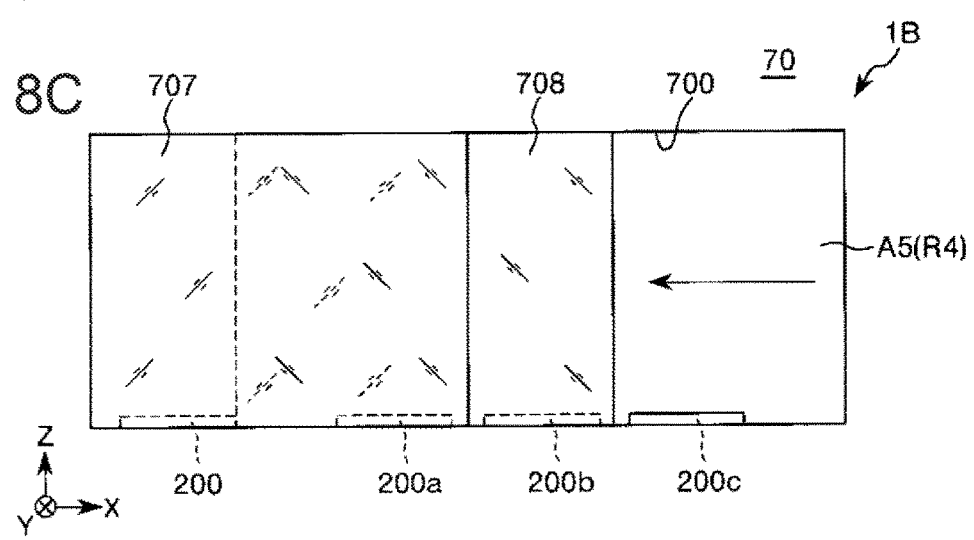

ELECTRONIC COMPONENT CARRYING DEVICE AND ELECTRONIC COMPONENT INSPECTION DEVICE

BACKGROUND

Technical Field

The present invention relates to an electronic component carrying device and an electronic component inspection device.

Background Art

Traditionally, an electronic component inspection device for inspecting electrical characteristics of an electronic component such as an IC device, for example, is known. In this electronic component inspection device, an electronic component carrying device for carrying an IC device to a holding unit of an inspection unit is incorporated. At the time of inspecting the IC device, the IC device is arranged on the holding unit and a plurality of probe pins provided in the holding unit and each terminal of the IC device are brought in contact with each other, and the inspection is thus carried out. At this time, the inspection is carried out in the state where the IC device is cooled. Also, the IC device on which the inspection is finished is held by a component holding device (see, for example, JP-A-2001-228206).

In the electronic component inspection device disclosed in JP-A-2001-228206, a heater is built in the component holding device and heats the IC device in the cooled state after the inspection. Thus, the occurrence of dew condensation is restrained when the IC device is taken out of the device.

However, in the electronic component inspection device disclosed in JP-A-2001-228206, the temperature or humidity in the space immediately before the IC device is taken out of the device is not controlled. Therefore, whether the heating of the IC device is sufficient or not is not known and there is a possibility that dew condensation may occur in the IC device when the IC device is taken out of the device.

An object of the invention is to provide an electronic component carrying device and an electronic component inspection device which can prevent dew condensation in an electronic component after an inspection.

SUMMARY

The foregoing object is achieved by the invention described below.

Application Example 1

An electronic component carrying device according to the invention includes:

a first chamber in which an electronic component can be arranged;

a second chamber in which the electronic component can be arranged and which is different from the first chamber; and a placing unit on which the electronic component can be placed and on which the electronic component can be moved from the first chamber to the second chamber.

At least one of humidity and temperature in the second chamber can be detected.

For example, if an inspection is carried out in an environment where temperature is lower than normal temperature, the electronic component in the first chamber is in a low-temperature state below normal temperature. When the electronic device in this low-temperature state is taken out of the electronic component carrying device, dew condensation may occur in the electronic device. According to the invention, the electronic component in the first chamber is briefly moved to the second chamber. Also, since at least one of humidity and temperature can be detected in the second chamber, the second chamber can be adjusted to a condition such that dew condensation does not occur, based on the result of the detection. Thus, the occurrence of dew condensation can be prevented or restrained from occurring in the electronic component taken out of the electronic component carrying device.

Application Example 2

It is preferable that the electronic component carrying device according to the invention has a first open/close door which is provided between the first chamber and the second chamber and which switches between a circulation state where air can circulate between the first chamber and the second chamber and a non-circulation state where the circulation of air is less than in the circulation state.

Thus, the electronic component can be moved from the first chamber to the second chamber, and a change in the temperature or humidity in the second chamber due to the opening/closing of the first open/close door can be restrained as much as possible.

Application Example 3

In the electronic component carrying device according to the invention, it is preferable that the non-circulation state is a state where the circulation of air between the first chamber and the second chamber is cut off.

Thus, a change in the temperature or humidity in the second chamber can be restrained as much as possible.

Application Example 4

In the electronic component carrying device according to the invention, it is preferable that a second open/close door which is arranged at a different position from the first open/close door and which enables circulation of air between the second chamber and outside is formed in the second chamber.

Thus, the electronic component can be taken out of the second chamber.

Application Example 5

In the electronic component carrying device according to the invention, it is preferable that the second open/close door can open and close by swinging or sliding.

Thus, when taking the electronic component out of the second chamber, the operation can be carried out smoothly.

Application Example 6

In the electronic component carrying device according to the invention, it is preferable that the second open/close door is installed at an opening provided in a wall part between the first chamber and the second chamber and can adjust a size of the opening.

Thus, when taking the electronic component out of the second chamber, the open/close door can be opened or closed at a minimum necessary level. Therefore, the environment in the second chamber can be restrained from varying due to the opening/closing of the open/close door.

Application Example 7

In the electronic component carrying device according to the invention, it is preferable that a length of time when the second open/close door is in an open state can be controlled.

Thus, the environment in the second chamber can be restrained from changing due to an external influence.

Application Example 8

It is preferable that the electronic component carrying device according to the invention has a plurality of the placing units, and that a staying time of the placing unit in the second chamber is measured, referring to the placing unit that is moved last to the second chamber, of the plurality of placing units.

Thus, dew condensation can be prevented or restrained from occurring in the electronic component on the placing unit that is moved last to the second chamber.

Application Example 9

In the electronic component carrying device according to the invention, it is preferable that if at least one of humidity and temperature in the second chamber meets a predetermined condition, the placing unit is moved from the first chamber to the second chamber.

Thus, when the electronic component is moved, an environment where dew condensation does not easily occur is formed in the second chamber. Therefore, dew condensation can be prevented or restrained from occurring in the electronic component in the second chamber.

Application Example 10

In the electronic component carrying device according to the invention, it is preferable that an air pressure in the second chamber is equal to or below an air pressure in the first chamber and equal to or above atmospheric pressure.

Thus, the environment in the second chamber can be restrained from changing due to an external influence.

Application Example 11

In the electronic component carrying device according to the invention, it is preferable that the electronic component is an electronic component after a predetermined inspection is carried out.

Thus, dew condensation can be prevented or restrained from occurring in the electronic component after the inspection.

Application Example 12

An electronic component inspection device according to the invention includes:

a first chamber in which an electronic component can be arranged;

a second chamber in which the electronic component can be arranged and which is different from the first chamber;

a placing unit on which the electronic component can be placed and on which the electronic component can be moved from the first chamber to the second chamber; and an inspection unit which inspects the electronic component.

At least one of humidity and temperature in the second chamber can be detected.

For example, if an inspection is carried out in an environment where temperature is lower than normal temperature, the electronic component in the first chamber is in a low-temperature state below normal temperature. When the electronic device in this low-temperature state is taken out of the electronic component inspection device, dew condensation may occur in the electronic device. According to the invention, the electronic component in the first chamber is briefly moved to the second chamber. Also, since at least one of humidity and temperature can be detected in the second chamber, the second chamber can be adjusted to a condition such that dew condensation does not occur, based on the result of the detection. Thus, dew condensation can be prevented or restrained from occurring in the electronic component taken out of the electronic component inspection device.

BRIEF DESCRIPTION OF DRAWINGS

FIGS. 8A to 8C are views for explaining a second open/close door provided in a third embodiment of the electronic component inspection device of the invention.

DETAILED DESCRIPTION

Hereinafter, the electronic component carrying device and the electronic component inspection device of the invention will be described in detail, based on preferred embodiments shown in the accompanying drawings.

First Embodiment

Figure 1:
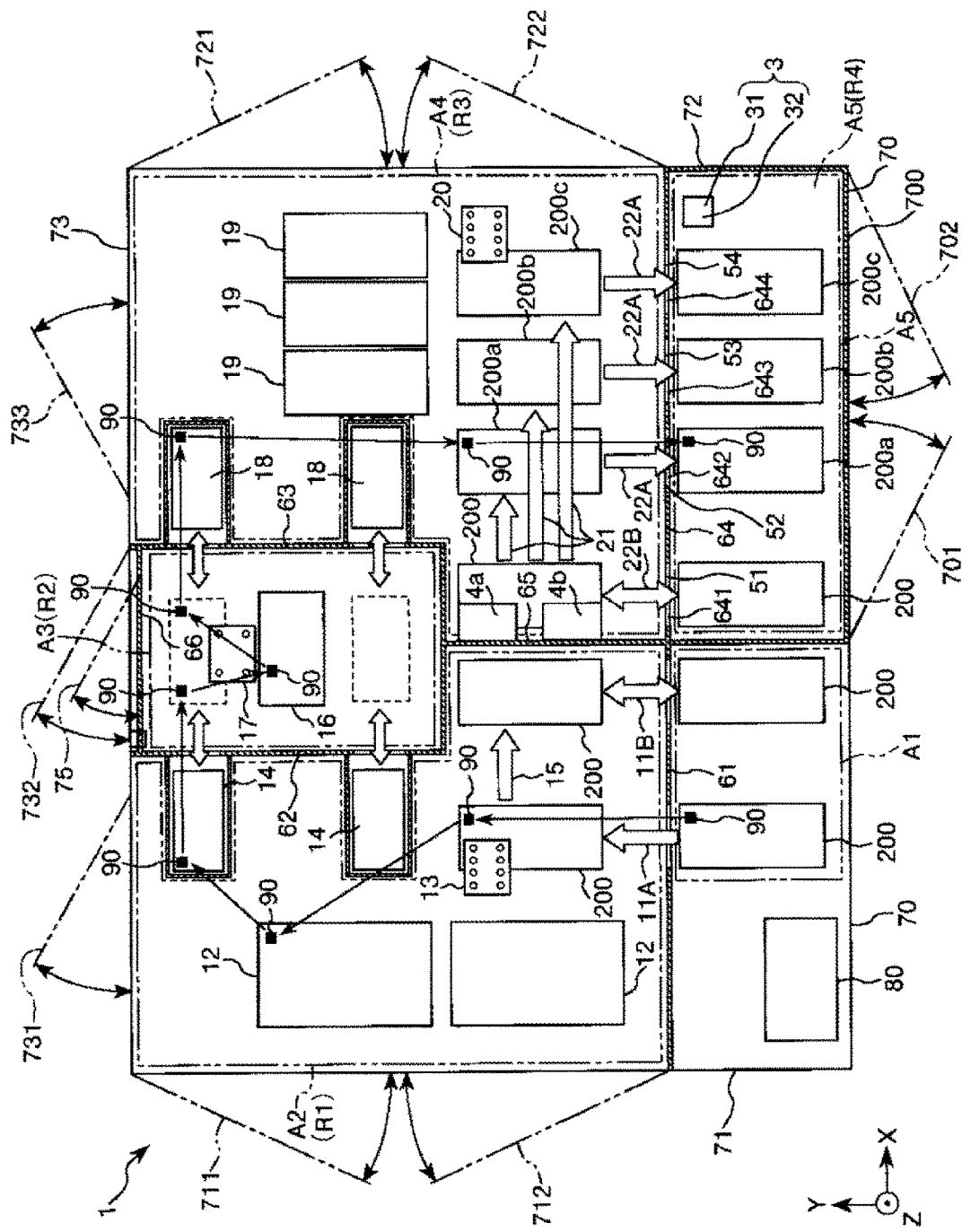
FIG. 1 is a schematic plan view showing a first embodiment of the electronic component inspection device of the invention.
Figure 2:
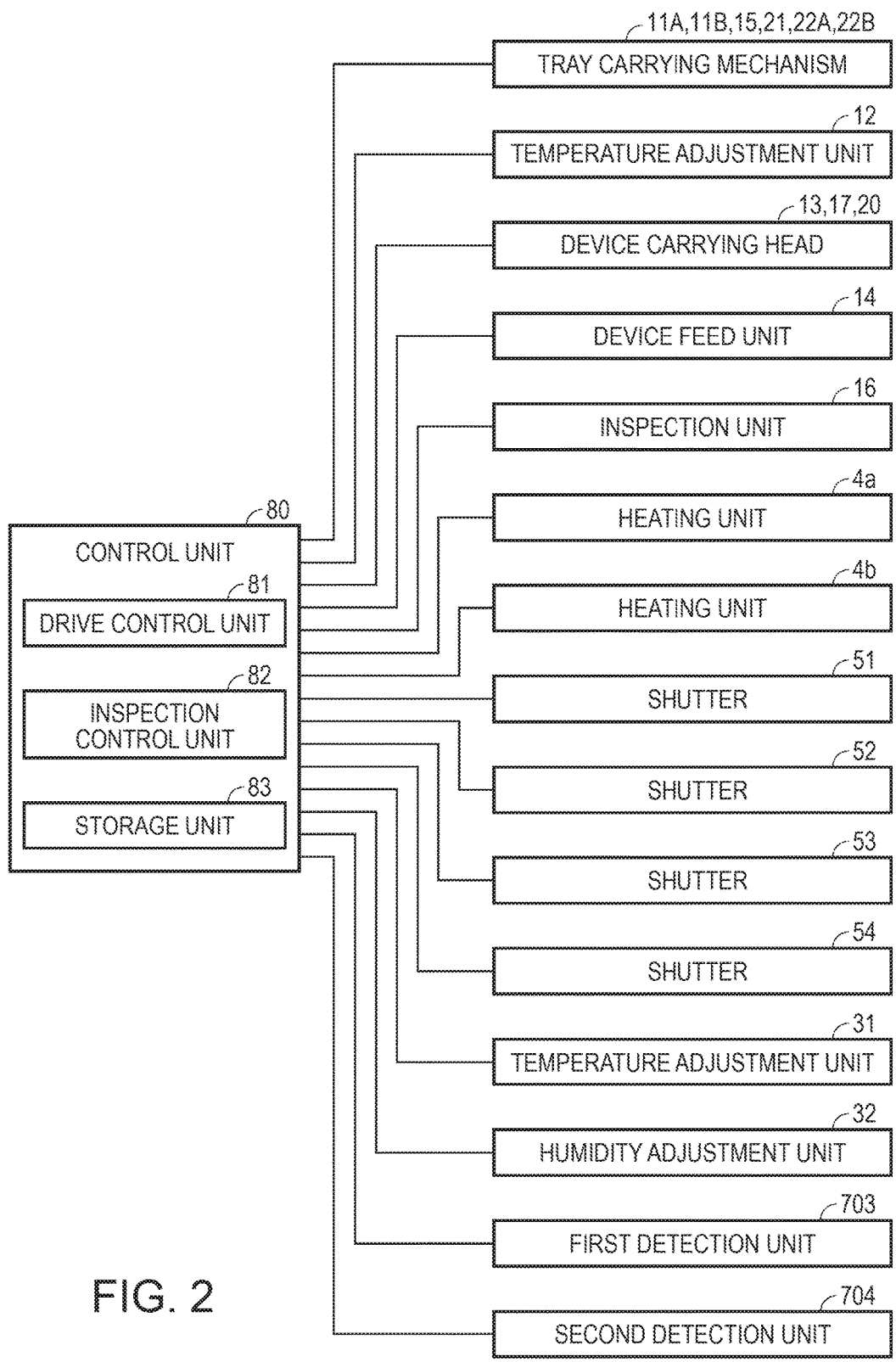
FIG. 2 is a block diagram of the electronic component inspection device shown in FIG. 1.
Figure 3:
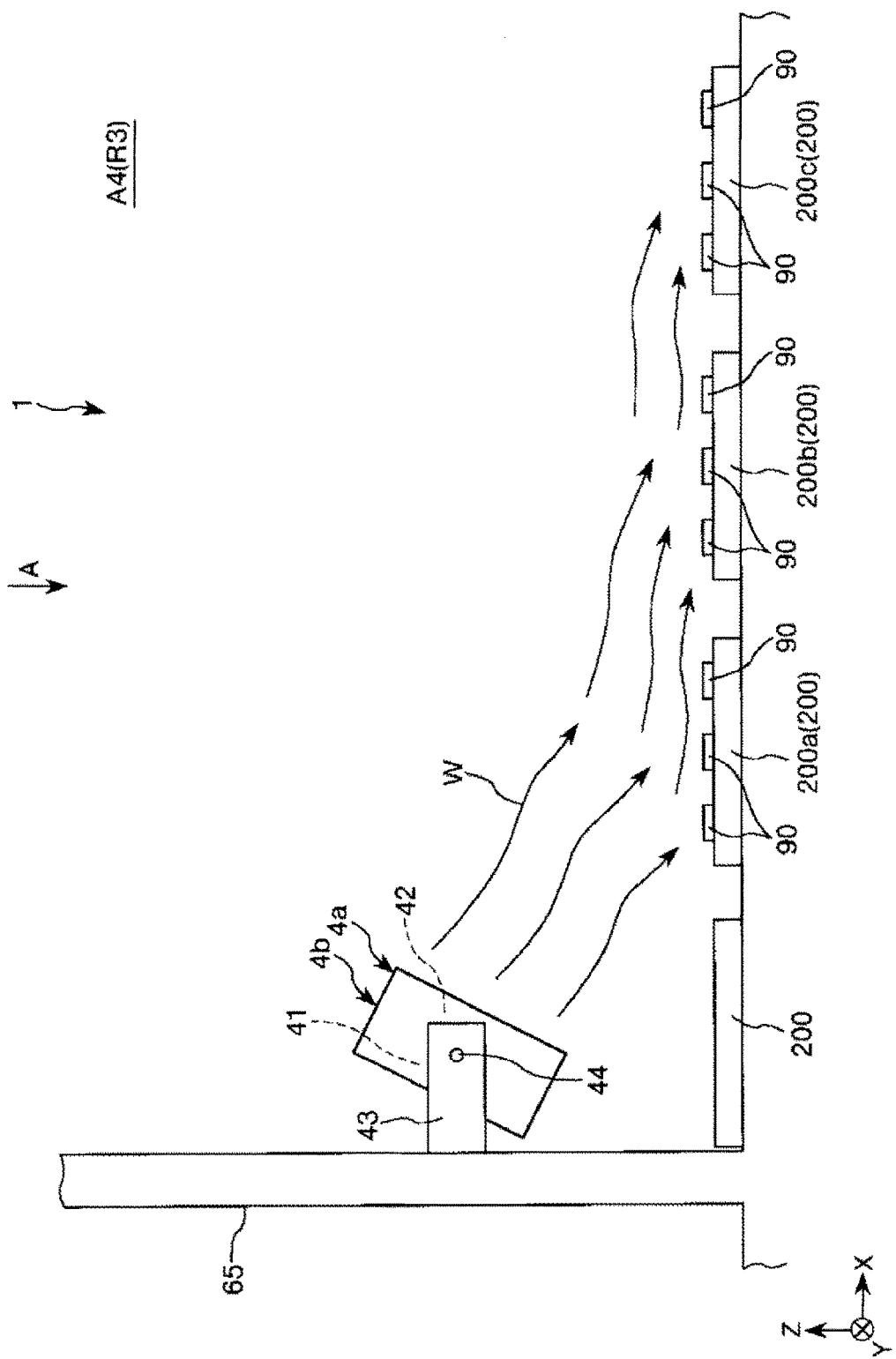
FIG. 3 is a view for explaining a heating unit provided in the electronic component inspection device shown in FIG. 1.
Figure 4:
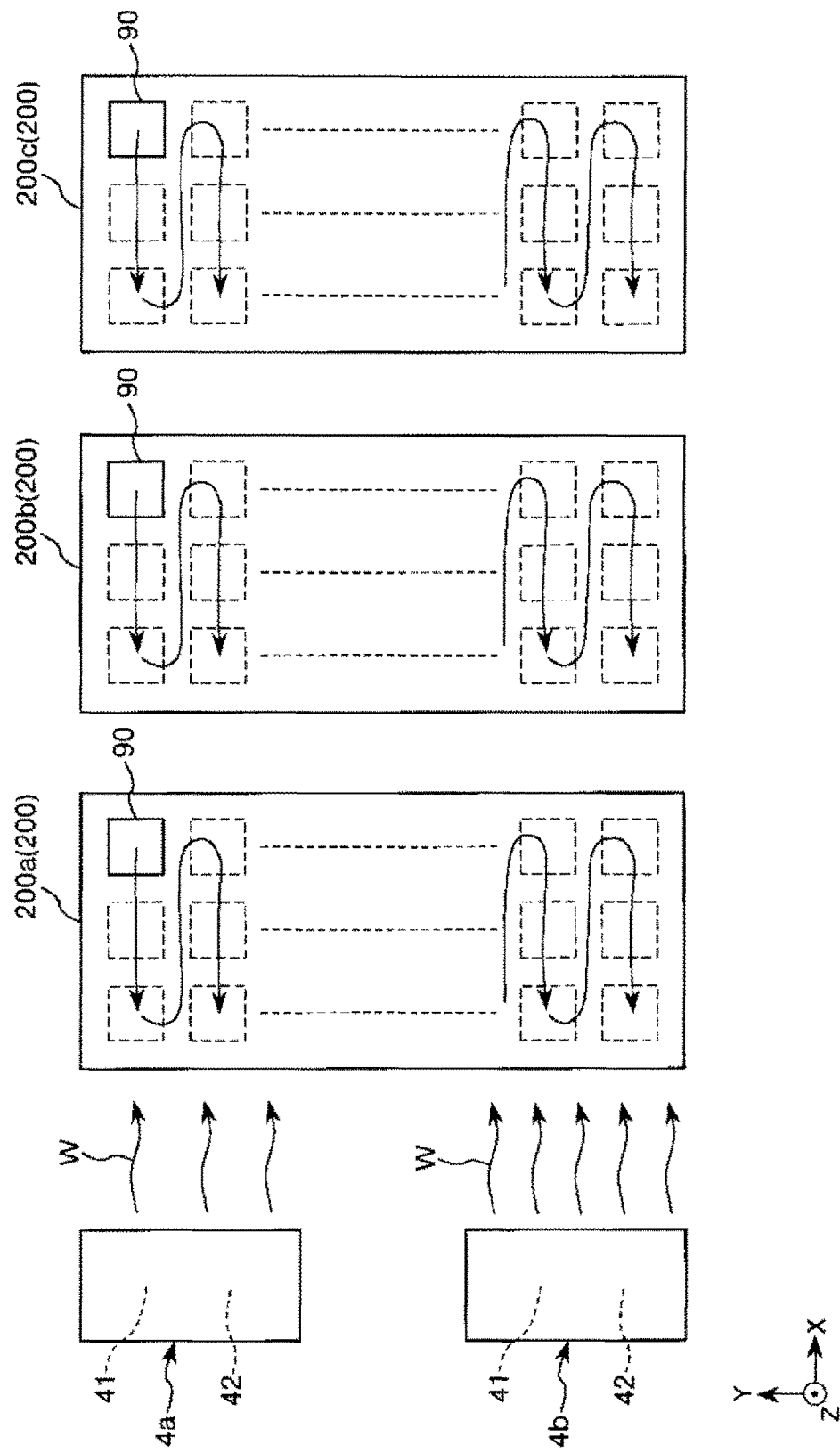
FIG. 4 is a view from the direction of an arrow A in FIG. 3.
Figure 5:
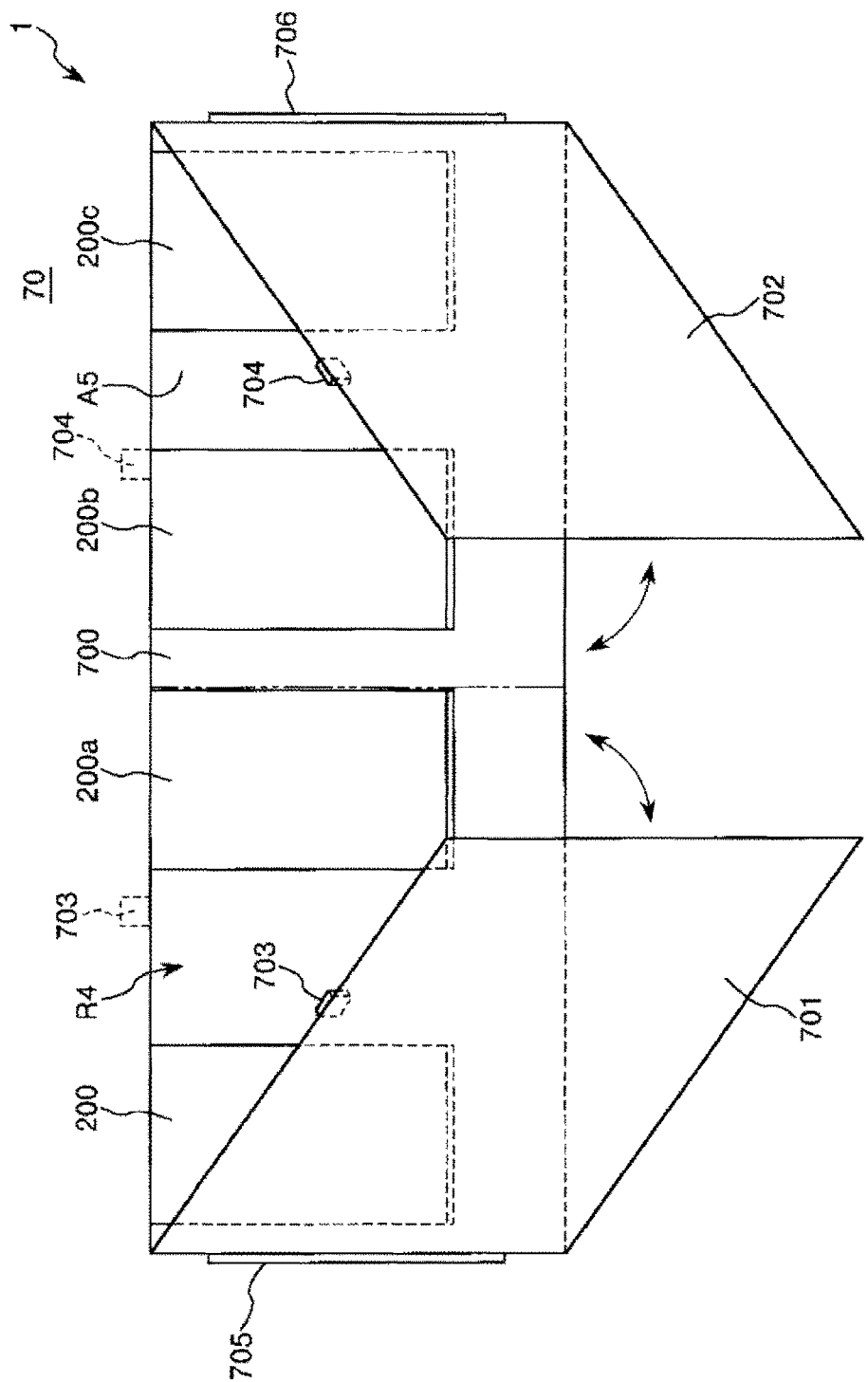
FIG. 5 is a view for explaining a second open/close door.
Figure 6:
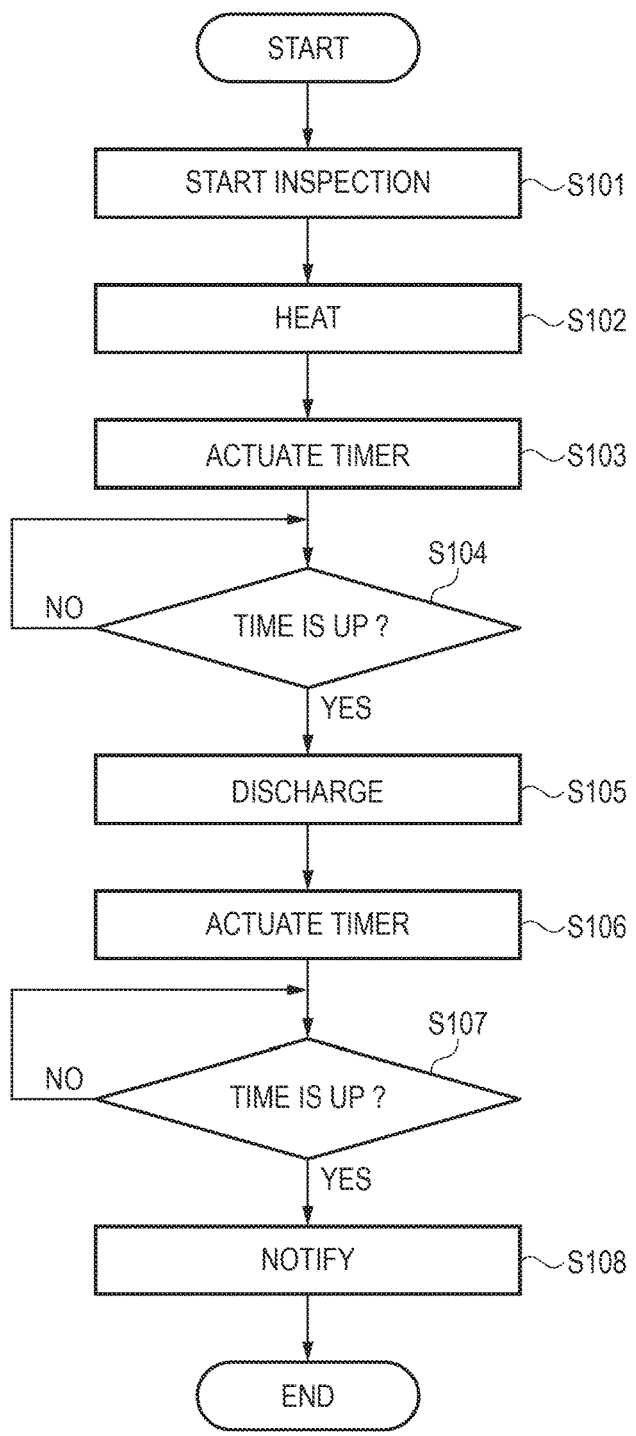
FIG. 6 is a flowchart for explaining a control operation of the electronic component inspection device shown in FIG. 1.

FIG. 1 is a schematic plan view showing a first embodiment of the electronic component inspection device of the invention. FIG. 2 is a block diagram of the electronic component inspection device shown in FIG. 1. FIG. 3 is a view for explaining a heating unit provided in the electronic component inspection device shown in FIG. 1. FIG. 4 is a view from the direction of an arrow A in FIG. 3. FIG. 5 is a view for explaining a second open/close door. FIG. 6 is a flowchart for explaining a control operation of the electronic component inspection device shown in FIG. 1.

In the description below, for the sake of convenience of the description, three axes orthogonal to each other are referred to as X-axis, Y-axis, and Z-axis, as shown in FIGS.

Figure 7:
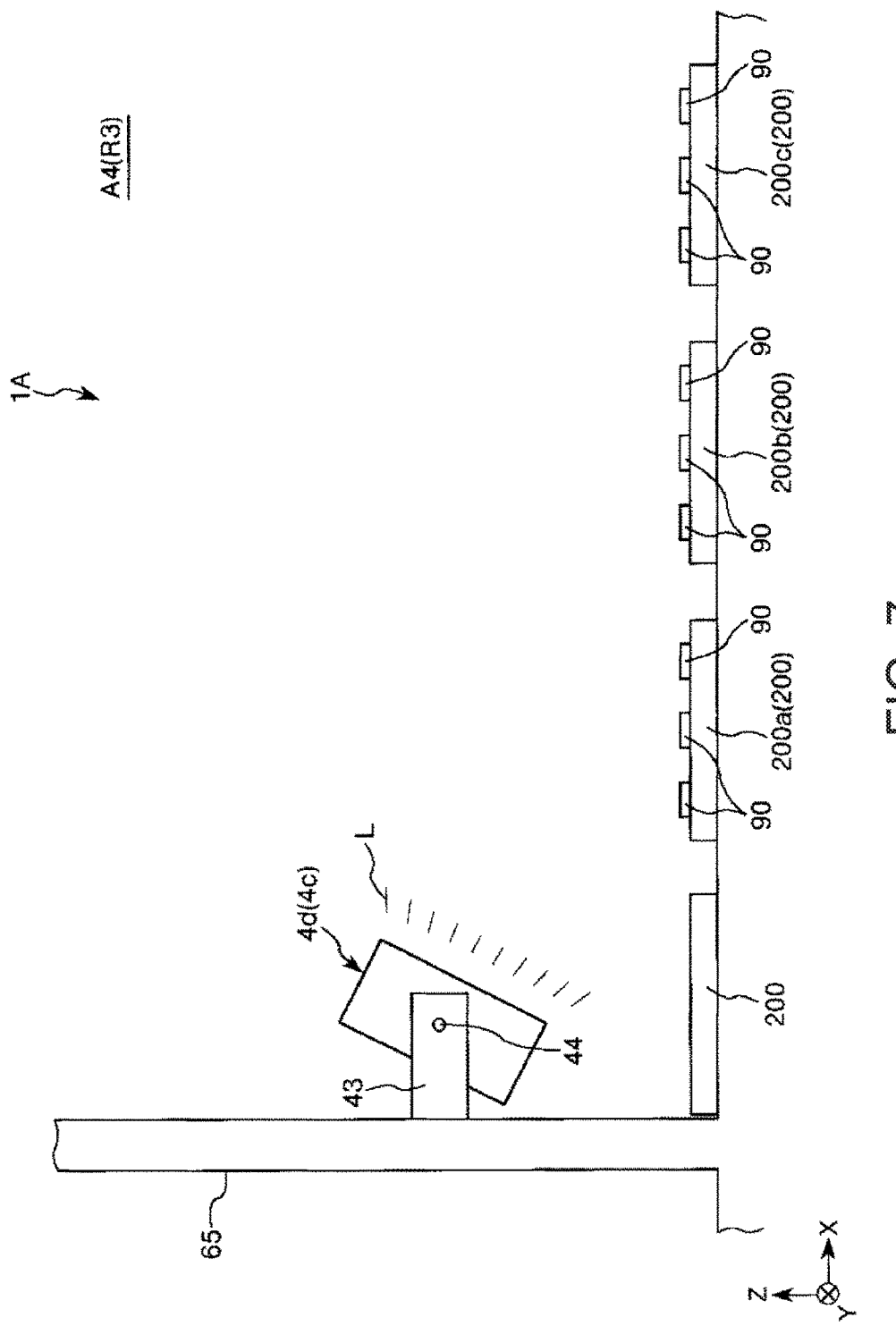
FIG. 7 is a view for explaining a heating unit provided in a second embodiment of the electronic component inspection device of the invention.

1, 3, and 4 (the same applies to FIGS. 7 and 8). Also, an X-Y plane including the X-axis and the Y-axis is horizontal, and the Z-axis is vertical. Also, a direction parallel to the X-axis is referred to as "X-direction", a direction parallel to the Y-axis is referred to as "Y-direction", and a direction parallel to the Z-axis is referred to as "Z-direction". Also, the upstream side in the direction of carrying an electronic component is simply referred to as "upstream" and the downstream side is simply referred to as "downstream". Moreover, the term "horizontal" in this specification is not limited to the perfect horizontal and includes slightly tilted states (for example, approximately by less than 5 degrees) from the horizontal unless the carrying of an electronic component is hindered.

An inspection device (electronic component inspection device) 1 shown in FIG. 1 is a device for inspecting and testing (hereinafter simply referred to as "inspection") electrical characteristics of an electronic component, for example, an IC device such as BGA (ball grid array) package or LGA (land grid array) package, an LCD (liquid crystal display), or a CIS (CMOS image sensor). In the description below, for the sake of convenience of the description, the case where an IC device is used as the electronic component to be inspected will be described as a representative example, and this is referred to as an "IC device 90".

As shown in FIG. 1, the inspection device 1 is divided into a tray feed area A1, a device feed area (hereinafter simply referred to as a "feed area") A2, an inspection area A3, a device collection area (hereinafter simply referred to as a "collection area") A4, and a tray removal area A5. Then, the IC device 90 passes through each of the areas in order from the tray feed area A1 to the tray removal area A5 and is inspected on its way in the inspection area A3. In this way, the inspection device 1 includes an electronic component carrying device for carrying the IC device 90 in each area, an inspection unit 16 which carries out inspection in the inspection area A3, and a control unit 80. In the inspection device 1, of the areas from the tray feed area A1 to the tray removal area A5, the area from the feed area A2 to the collection area A4 where the IC device 90 is carried can also be referred to as a "carrying area".

In the inspection device 1, the side where the tray feed area A1 and the tray removal area A5 are arranged (bottom side in FIG. 1) is the front side, and the opposite side, that is, the side where the inspection area A3 is arranged (top side in FIG. 1) is used as the back side.

The tray feed area A1 is a material feed section where a tray (placing unit) 200 having a plurality of IC devices 90 in an uninspected state arrayed thereon is fed. In the tray feed area A1, multiple trays 200 can be stacked on each other.

The feed area A2 is an area where each of a plurality of IC devices 90 arranged on the tray 200 from the tray feed area A1 is fed to the inspection area A3. Tray carrying mechanisms 11A, 11B which carry the trays 200 one by one are provided, spanning the tray feed area A1 and the feed area A2.

In the feed area A2, a temperature adjustment unit (soaking plate) 12, a device carrying head 13, and a tray carrying mechanism (first carrying device) 15 are provided.

The temperature adjustment unit 12 is a placing unit where a plurality of IC devices 90 is placed, and can heat or cool the plurality of IC devices 90. Thus, the IC devices 90 can be adjusted to a temperature suitable for inspection. In the configuration shown in FIG. 1, two temperature adjustment units 12 are arranged and fixed in the Y-direction. Then, the IC devices 90 on the tray 200 carried in (carried thereto) from the tray feed area A1 by the tray carrying mechanism 11A are carried and placed on one of the temperature adjustment units 12.

The device carrying head 13 is supported in such a way as to be movable in the device feed area A2. Thus, the device carrying head 13 can take charge of the carrying of the IC devices 90 between the tray 200 carried in from the tray feed area A1 and the temperature adjustment unit 12, and the carrying of the IC devices 90 between the temperature adjustment unit 12 and a device feed unit 14, described later.

The tray carrying mechanism 15 is a mechanism which carries an empty tray 200 from which all IC devices 90 have been removed, in the X-direction in the feed area A2. Then, after the carrying, the empty tray 200 is returned from the feed area A2 to the tray feed area A1 by the tray carrying mechanism 11B.

The inspection area A3 is an area where the IC device 90 is inspected. In this inspection area A3, the device feed unit (feed shuttle) 14, the inspection unit 16, a device carrying head 17, and a device collection unit (collection shuttle) 18 are provided.

The device feed unit 14 is a placing unit where the temperature-adjusted IC devices 90 are placed, and can carry these IC devices 90 to the vicinity of the inspection unit 16. This device feed unit 14 is supported in such a way as to be movable along the X-direction between the feed area A2 and the inspection area A3. Also, in the configuration shown in FIG. 1, two device feed units 14 are arranged in the Y-direction, and the IC devices 90 on the temperature adjustment unit 12 are carried to and placed on one of the device feed units 14.

The inspection unit 16 is a unit which inspects and tests electrical characteristics of the IC devices 90. In the inspection unit 16, a plurality of probe pins electrically connected to the IC devices 90 in the state of holding the IC devices 90 is provided. Then, the terminals of the IC devices 90 and the probe pins are electrically connected to each other (come in contact with each other), and an inspection on the IC devices 90 is carried out via the probe pins. The inspection unit 16, similarly to the temperature adjustment unit 12, can heat or cool the IC devices 90 and thus adjust these IC devices 90 to a temperature suitable for inspection.

The device carrying head 17 is supported in such a way as to be movable in the inspection area A3. Thus, the device carrying head 17 can carry and place the IC devices 90 on the device feed unit 14 carried in from the feed area A2, onto the inspection unit 16.

The device collection unit 18 is a placing unit where the IC devices 90 on which the inspection by the inspection unit 16 is finished are placed, and can carry these IC devices 90 to the collection area A4. This device collection unit 18 is supported in such a way as to be movable along the X-direction between the inspection area A3 and the collection area A4. Also, in the configuration shown in FIG. 1, two device collection units 18 are arranged in the Y-direction, similarly to the device feed units 14, and the IC devices 90 on the inspection unit 16 are carried to and placed on one of the device collection units 18. This carrying is carried out by the device carrying head 17.

The collection area (first chamber) A4 is an area where a plurality of IC devices 90 on which an inspection is finished is collected. In this collection area A4, a collection tray 19, a device carrying head 20, and a tray carrying mechanism (second carrying device) 21 are provided. Also, the empty tray 200 is prepared in the collection area A4.

The collection tray 19 is a placing unit where the IC devices 90 are placed, and is fixed in the collection area A4.

In the configuration shown in FIG. 1, three collection trays 19 are arranged along the X-direction. Also, the empty tray 200, too, is a placing unit where the IC devices 90 are placed, and three empty trays are arranged along the X-direction. Then, the IC devices 90 on the device collection unit 18 moved to the collection area A4 are carried to and placed on one of these collection trays 19 and the empty trays 200. Thus, the IC devices 90 are collected and classified, based on the result of the inspection.

When the three trays 200 are referred to as trays 200a, 200b, and 200c from the left in FIG. 1, the IC devices 90 with the result of the inspection being "good" are placed on the tray 200a. Meanwhile, the IC devices 90 with the result of the inspection being "to be re-inspected" are placed on the tray 200b. Then, the IC devices 90 with the result of the inspection being "no good" are placed on the tray 200c.

In this way, in the inspection device 1, the IC devices 90 ranked according to the result of the inspection and are categorized and arranged on the different trays 200a to 200c.

The device carrying head 20 is supported in such a way as to be movable in the collection area A4. Thus, the device carrying head 20 can carry the IC devices 90 from the device collection unit 18 to the collection tray 19 or the empty tray 200.

The tray carrying mechanism 21 is a mechanism which carries the empty tray 200 carried in from the tray removal area A5, in the X-direction in the collection area A4. Then, after this carrying, the empty tray 200 is situated at the position where the IC devices 90 are collected, that is, can be one of the three empty trays 200. In this way, in the inspection device 1, the tray carrying mechanism 21 is provided in the collection area A4, and in addition to this, the tray carrying mechanism 15 is provided in the feed area A2. Thus, an improvement in throughput (number of IC devices 90 carried per unit time) can be achieved, for example, compared with the case where the carrying of the empty tray 200 in the X-direction is carried out by a single carrying mechanism.

The configuration of the tray carrying mechanisms 15, 21 is not particularly limited. For example, a configuration having a suction member which attracts the tray 200 by suction and a support mechanism such as a ball screw which supports the suction member in such a way as to be movable in the X-direction may be employed.

The tray removal area A5 is a material removing section where the tray 200 on which a plurality of IC devices 90 in an inspected state is arrayed is collected and removed. In the tray removal area A5, multiple trays 200 can be stacked on each other.

Also, tray carrying mechanisms 22A, 22B which carry the trays 200 one by one are provided, spanning the collection area A4 and the tray removal area A5. The tray carrying mechanism 22A is a mechanism which carries the tray 200 where the inspected IC devices 90 which have been inspected are placed, from the collection area A4 to the tray removal area A5. The tray carrying mechanism 22B is a mechanism which carries the empty tray 200 for collecting the IC devices 90, from the tray removal area A5 to the collection area A4.

In the inspection device 1 as described above, the device carrying head 13, the device feed unit 14, and the device carrying head 17 are configured to be able to heat or cool the IC devices 90, other than the temperature adjustment unit 12 and the inspection unit 16. Thus, the IC devices 90 are maintained at a constant temperature while being carried. Then, in the description below, the case where cooling of the IC devices 90 is carried out and where an inspection is carried out in a low-temperature environment within a range of, for example, −60° C. to −40° C. will be explained.

As shown in FIG. 1, in the inspection device 1, the tray feed area A1 and the feed area A2 are marked off (partitioned) from each other by a first partition wall 61. The feed area A2 and the inspection area A3 are marked off from each other by a second partition wall 62. The inspection area A3 and the collection area A4 are marked off from each other by a third partition wall 63. The collection area A4 and the tray removal area A5 are marked off from each other by a fourth partition wall 64. Also, the feed area A2 and the collection area A4 are marked off from each other by a fifth partition wall 65. These partition walls have the function of keeping airtightness of each area. Moreover, inspection device 1 has its outermost face covered with a cover, and this cover includes, for example, a front cover 70, side covers 71 and 72, and a rear cover 73.

Then, the feed area A2 is a first chamber R1 demarcated by the first partition wall 61, the second partition wall 62, the fifth partition wall 65, the side cover 71, and the rear cover 73. A plurality of IC devices 90 in an uninspected state is carried with the tray 200 into the first chamber R1.

The inspection area A3 is a second chamber R2 demarcated by the second partition wall 62, the third partition wall 63, and the rear cover 73. Also, in the second chamber R2, an inner partition wall 66 is arranged more inside than the rear cover 73.

The collection area A4 is a third chamber (first chamber) R3 demarcated by the third partition wall 63, the fourth partition wall 64, the fifth partition wall 65, the side cover 72, and the rear cover 73. A plurality of IC devices 90 on which an inspection is finished is carried into the third chamber R3 from the second chamber R2.

The tray removal area A5 is a fourth chamber (second chamber) R4 demarcated by the fourth partition wall 64, the fifth partition wall 65, the side cover 72, and the front cover 70. A plurality of IC devices 90 on which an inspection is completed is carried with the tray 200 into the fourth chamber R4 from the third chamber R3.

Also, in the fourth chamber R4, four trays 200 can be arranged along the X-direction. Of these, an empty tray 200 is arranged to the leftmost side in FIG. 1. This empty tray 200 is carried into the third chamber R3 by the tray carrying mechanism 22B. Also, to the right of the empty tray 200, the trays 200a to 200c carried in from the third chamber R3 are arranged respectively.

Also, the fourth partition wall 64 is provided with four openings 641, 642, 643, 644 penetrating the fourth partition wall 64 in the direction of its thickness. These openings 641 to 644 are arranged in this order from the left in FIG. 1. The opening 641 is a part through which the empty tray 200 passes from the fourth chamber R4 toward the third chamber R3. The opening 642 is a part through which the tray 200a passes from the third chamber R3 toward the fourth chamber R4. The opening 643 is a part through which the tray 200b passes from the third chamber R3 toward the fourth chamber R4. The opening 644 is apart through which the tray 200c passes from the third chamber R3 toward the fourth chamber R4.

Also, the opening 641 is provided with a shutter 51. The opening 642 is provided with a shutter 52. The opening 643 is provided with a shutter 53. The opening 644 is provided with a shutter 54. These shutters (first doors) 51 to 54 move up and down in a vertical direction (Z-direction) and thus operate to open and close their respective openings 641 to 644 independently. These shutters 51 to 54 are electrically connected respectively to the control unit 80 and have their actuation controlled. Thus, the shutters 51 to 54 can switch between a circulation state where air can circulate between the third chamber R3 and the fourth chamber R4 and a non-circulation state where the circulation of air is less than in the circulation state. Therefore, the circulation state is set only when necessary, and the non-circulation state can be set otherwise. Thus, change in the temperature and humidity in the fourth chamber R4 can be restrained as much as possible.

As shown in FIG. 1, the side cover 71 is provided with a first door (left first door) 711 and a second door (left second door) 712. Opening the first door 711 and the second door 712 allows, for example, maintenance and clearing of a jam in the IC devices 90 or the like (hereinafter collectively referred to as "work"), for example, in the first chamber R1 to be carried out. The first door 711 and the second door 712 forma so-called "double-leaf door", opening and closing in the opposite directions from each other. Also, at the time of work in the first chamber R1, moving parts such as the device carrying head 13 in the first chamber R1 stop.

Similarly, the side cover 72 is provided with a first door (right first door) 721 and a second door (right second door) 722. Opening the first door 721 and the second door 722 allows, for example, work in the third chamber R3 to be carried out. The first door 721 and the second door 722, too, form a so-called "double-leaf door", opening and closing in the opposite directions from each other. Also, at the time of work in the third chamber R3, moving parts such as the device carrying head 20 in the third chamber R3 stop.

Also, the rear cover 73 is provided with a first door (rear first door) 731, a second door (rear second door) 732, and a third door (rear third door) 733. Opening the first door 731 allows, for example, work in the first chamber R1 to be carried out. Opening the third door 733 allows, for example, work in the third chamber R3 to be carried out. Moreover, the inner partition wall 66 is provided with a fourth door 75. Then, opening the second door 732 and the fourth door 75 allows, for example, work in the second chamber R2 to be carried out. The first door 731, the second door 732, and the fourth door 75 open and close in the same direction, and the third door 733 opens and closes in the direction opposite to these doors. Also, at the time of work in the second chamber R2, moving parts such as the device carrying head 17 in the second chamber R2 stop.

Also, as shown in FIGS. 1 and 5, an opening 700 of the front cover 70 is provided with a first open/close door 701 and a second open/close door 702. The first door 701 is installed in such a way as to be able to swing by a swing support part 705 provided at an end on the negative side in the X-direction of the opening 700. Meanwhile, the second door 702 is installed in such a way as to be able to swing by a swing support part 706 provided at an end on the positive side in the X-direction of the opening 700. The first open/close door 701 and the second open/close door 702 form a so-called "double-leaf door", opening and closing in the opposite directions from each other.

Opening the first open/close door 701 allows, for example, the work of replenishing or extracting the empty tray 200 and the tray 200*a* to be carried out. Also, opening the second open/close door 702 allows, for example, the work of extracting the tray 200*b* and the tray 200*c* to be carried out.

As shown in FIG. 2, the control unit 80 has a drive control unit 81, an inspection control unit 82, and a storage unit 83.

The drive control unit 81 controls the driving of each unit such as the tray carrying mechanisms 11A, 11B, the temperature adjustment unit 12, the device carrying head 13, the device feed unit 14, the tray carrying mechanism 15, the inspection unit 16, the device carrying head 17, the device collection unit 18, the device carrying head 20, the tray carrying mechanism 21, and the tray carrying mechanisms 22A, 22B.

The inspection control unit 82 carries out an inspection or the like on electrical characteristics of the IC devices 90 arranged on the inspection unit 16, based on a program stored in the storage unit 83.

The storage unit 83 is made up of, for example, a volatile memory such as RAM, a non-volatile memory such as ROM, a rewritable (erasable-rewritable) non-volatile memory such as EPROM, EEPROM or flash memory, or various semiconductor memories (IC memories).

As shown in FIGS. 1, 3 and 4, a pair of heating unit 4*a* and heating unit 4*b* is provided on the surface on the positive side in the X-direction of the fifth partition wall 65 of the third chamber R3. The heating units 4*a*, 4*b* are arrayed in this order from the positive side in the Y-direction and spaced apart from each other. Also, as shown in FIG. 3, the heating units 4*a*, 4*b* are installed at the same height, that is, at the same position in the Z-direction.

Since the respective heating units 4*a*, 4*b* have substantially the same configuration, the heating unit 4*b* will be described below as a representative example.

The heating unit 4*b* has a heat generating body 41 and a fan 42 which sends air heated by the heat generating body 41 (hereinafter referred to as "warm air W"). This heating unit 4*b* is fixed to the fifth partition wall 65 by a pair of support members 43. Also, in the heating unit 4*b*, the pair of support members 43 has a swing support part 44 and thus supports and fixes the heating unit 4*b* in such a way as to be able to swing. Therefore, the heating unit 4*b* can adjust the direction in which the warm air W is sent. That is, in the heating unit 4*b*, the direction of sending out heat is variable.

As shown in FIG. 3, in the inspection device 1, the heating unit 4*b* is in the state of tilting slightly downward and faces the trays 200*a*, 200*b*, 200*c*. This allows the warm air W to be sent towards the IC devices 90 placed on the trays 200*a* to 200*c*. Thus, the IC devices 90, cooled after an inspection, can be heated. Therefore, the IC devices 90 can be prevented from being discharged out of the device while still being cooled. Consequently, the attachment of droplets to the IC devices 90 occurring when the cooled IC devices 90 are discharged in this state out of the inspection device 1, that is, dew condensation, can be prevented.

Particularly, in the inspection device 1, the heating units 4*a*, 4*b* are arranged in places spaced apart from the trays 200*a* to 200*c* and therefore can be prevented from hindering the operation of carrying the IC devices 90 to the trays 200*a* to 200*c* by the device carrying head 20. Therefore, the occurrence of dew condensation in the IC devices 90 can be prevented while a reduction in throughput is prevented.

Moreover, in the traditional technique, the provision of a heating unit for each placing unit where the IC devices 90 are placed can be omitted and an increase in costs can be restrained accordingly.

As shown in FIG. 3, the heating units 4*a*, 4*b* are directed toward the tray 200*a* on the side proximal to the heating units 4*a*, 4*b*, of the trays 200*a* to 200*c*. Therefore, the warm air W sent from the heating units 4*a*, 4*b* first strikes the IC devices 90 on the tray 200*a*. Then, the warm air W, after striking the tray 200*a*, flows as it is toward the positive side in the X-direction and strikes the IC devices 90 on the trays 200*b*, 200*c* in order.

As described above, the IC devices 90 with the result of the inspection being "good" are placed on the tray 200*a*. The IC devices 90 with the result of the inspection being "to be re-inspected" are placed on the tray 200b. The IC devices 90 with the result of the inspection being "no good" are placed on the tray 200c. Therefore, the heating units 4a, 4b can heat the IC devices 90 in order from those ranked the highest based on the result of the inspection, that is, preferentially. Thus, the "good" IC devices can be heated predominantly. Moreover, the "no good" IC devices are to be discarded in that state and therefore dew condensation due to insufficient heating may occur therein. Thus, it suffices to heat the "good" and "to be re-inspected" IC devices, and an increase in the power consumed by the heating units 4a, 4b can be prevented.

Here, as shown in FIG. 4, the IC devices 90 are arranged one by one in the form of a matrix on the tray 200a (the same applies to the trays 200b, 200c). At this point, in the inspection device 1, as indicated by arrows in FIG. 4, a plurality of (in this embodiment, three) IC devices 90 are arranged from the top right in FIG. 4 to the left in FIG. 4, and then arranged from the right to the left below that line. As such placement is repeated, the IC devices 90 are placed in the form of a matrix on the tray 200a.

According to such a placement method, the IC devices 90 at the bottom in FIG. 4, which are arranged later, are heated by the heating units 4a, 4b for a shorter timer than the IC devices 90 at the top in FIG. 4, which are arranged earlier. Therefore, the IC devices 90 at the top in FIG. 4, which are arranged earlier, tend to be heated excessively, depending on the state of inspection, and the IC devices 90 at the bottom in FIG. 4, which are arranged later, tend to be heated insufficiently. Thus, the inspection device 1 is configured in such a way that the warm air W from the heating unit 4b has a higher temperature than that of the warm air W sent from the heating unit 4a. Thus, the amount of heat per unit time provided for the IC devices 90 arranged later can be made greater than the amount of heat per unit time provided for the IC devices 90 arranged earlier. Therefore, the IC devices 90 arranged earlier can be prevented from being heated excessively, and the IC devices 90 arranged later can be heated sufficiently. Based on these, the IC devices 90 can be heated without excess or deficiency in the inspection device 1.

Moreover, with the traditional technique, as soon as the IC devices 90 are placed up to the bottom left corner in FIG. 4 on the tray 200a, that is, as soon as the accommodation limit of the tray 200a is reached, the tray is moved to the fourth chamber R4. In contrast, in the inspection device 1, even when the accommodation limit of the tray 200a is reached, the movement to the fourth chamber R4 is regulated until the replacement of the tray 200a is needed in order to place the next IC devices 90. Thus, the time of heating the IC devices 90 placed on the tray 200a can be made as long as possible. Therefore, the occurrence of dew condensation in the IC devices 90 can be prevented more securely.

In this way, in the inspection device 1, the timing of starting the movement from the third chamber R3 to the fourth chamber R4 is adjusted according to the state of carrying the IC devices 90 onto the tray 200a.

Also, the inspection device 1 is configured in such a way that the time from the placement of the first IC device 90 on the tray 200a (the same applies to the trays 200b, 200c) is measured and that the tray 200a is moved from the third chamber R3 to the fourth chamber R4 when the measured time exceeds a threshold. Thus, the IC devices 90 can be prevented from being heated excessively.

Next, the fourth chamber R4 will be described.

As shown in FIGS. 1 and 2, the fourth chamber R4 is provided with a management unit 3 including a temperature adjustment unit 31 and a humidity adjustment unit 32, and the temperature and humidity in the fourth chamber R4 are managed.

The temperature adjustment unit 31 has the function of adjusting the temperature in the fourth chamber R4 and its actuation is controlled by the control unit 80. The humidity adjustment unit 32 has the function of adjusting the humidity in the fourth chamber R4 and its actuation is controlled by the control unit 80.

In the inspection device 1, the temperature in the fourth chamber R4 is maintained to, for example, approximately 10 to 35° C. by the temperature adjustment unit 31, and the humidity in the fourth chamber R4 is maintained to approximately 0 to 20% by the humidity adjustment unit 32. As the trays 200a to 200c where the IC devices 90 are placed are made to stay for a predetermined time in the fourth chamber R4 with such an environment, the IC devices 90 in the cooled state after an inspection can be heated sufficiently in an environment where dew condensation does not easily occur. Thus, the occurrence of dew condensation in the IC devices 90 can be prevented when the IC devices 90 are taken out of the fourth chamber R4.

With such a fourth chamber R4, along with the heating of the IC devices 90 by the heating units 4a, 4b, the occurrence of dew condensation in the IC devices 90 can be prevented or restrained more securely.

Also, the "predetermined time" is a time during which dew condensation does not occur when the IC devices 90 are made to stay in the fourth chamber R4 and then taken out of the fourth chamber R4 prior to an inspection, and an experimentally obtained value. In the experiment, it is preferable that the heating by the heating units 4a, 4b is omitted. Thus, the occurrence of dew condensation in the IC devices 90 can be prevented or restrained more securely.

Also, in the inspection device 1, for example, in the case where the trays 200a to 200c are moved from the third chamber R3 to the fourth chamber R4 in this order, the measurement of the staying time is started after the tray 200c is moved to the fourth chamber R4. Thus, the occurrence of dew condensation in the IC devices 90 on the tray 200c, which is moved last, can be prevented.

Also, in the inspection device 1, the movement of the trays 200a to 200c from the third chamber R3 to the fourth chamber R4 is carried out after the temperature and humidity in the fourth chamber R4 reach the foregoing numerical ranges. That is, if the temperature and humidity in the fourth chamber R4 are out of the foregoing numerical ranges, the movement of the trays 200a to 200c from the third chamber R3 to the fourth chamber R4 is regulated. Since the trays 200a to 200c are moved to the fourth chamber R4 after an environment where dew condensation does not easily occur in the IC devices 90 is thus arranged, the occurrence of dew condensation in the IC devices 90 in the fourth chamber R4 can be prevented or restrained.

Also, the air pressure in the fourth chamber R4 is equal to or above atmospheric pressure and equal to or below the air pressure in the third chamber R3. Thus, for example, even if the first open/close door 701 or the second open/close door 702 is opened in the state where the shutters 51 to 54 are in the open state, causing the third chamber R3 and the fourth chamber R4 to communicate with each other, it can be made harder for the outside air to enter the inside of the inspection device 1.

The method for controlling the air pressure in the fourth chamber R4 is not particularly limited. For example, methods such as introducing the outside air using a pump, sending air by a fan, or connecting a gas cylinder or the like to supply a gas, may be employed.

Also, at the time of moving the tray 200 in and out, the work can be carried out, opening one of the first open/close door 701 and the second open/close door 702. Thus, if the work is carried out opening the door closer to the part where the tray 200 is to be moved in and out, of the first open/close door 701 and the second open/close door 702, the entry of the outside air into the fourth chamber R4 can be restrained as much as possible.

Also, the first open/close door 701 and the second open/close door 702 can freely swing and can adjust the degree of opening/closing. Therefore, at the time of moving the tray 200 in and out, if the first open/close door 701 and the second open/close door 702 are set to a minimum degree of opening, the entry of the outside air into the fourth chamber R4 can be restrained as much as possible.

On the front cover 70, a first detection unit 703 which detects the opening/closing of the first open/close door 701, and a second detection unit 704 which detects the opening/closing of the second open/close door 702. The first detection unit 703 and the second detection unit 704 are each made up of, for example, a magnet sensor, and are electrically connected to the control unit 80.

By the first detection unit 703 and the second detection unit 704, the opening/closing of the first open/close door 701 and the second open/close door 702 can be detected. Thus, in the inspection device 1, if the first open/close door 701 and the second open/close door 702 are in a release state for a predetermined time, a notification mechanism, not illustrated, can notify the operator that the doors are left open for a long time. In this way, in the inspection device 1, since the opening/closing of the first open/close door 701 and the second open/close door 702 is controlled based on time, the entry of the outside air into the fourth chamber R4 can be restrained as much as possible.

As described above, in the inspection device 1, the IC devices 90 after an inspection are subjected to primary heating by the heating units 4a, 4b and secondary heating in the fourth chamber R4. Therefore, the occurrence of dew condensation in the IC devices 90 taken out of the inspection device 1 can be prevented or restrained effectively.

Next, the control operation of the inspection device 1 will be described, using the flowchart shown in FIG. 6.

First, an inspection on the IC devices 90 is started (Step S101).

The IC devices 90, which pass through the tray feed area A1, the feed area A2, and the inspection area A3 in order and on which an inspection is completed, are placed on one of the trays 200a to 200c in the collection area A4.

Then, with the actuation of the heating units 4a, 4b, the IC devices 90 are heated (Step S102).

At this point, a timer (not illustrated) is actuated simultaneously with the start of heating by the heating units 4a, 4b (Step S103).

Then, in Step S104, whether time is up or not is determined. If it is determined in Step S104 that time is up, the heating of the IC devices 90 is regarded as sufficient and the IC devices 90 are discharged along with the trays 200a to 200c to the tray removal area A5 (Step S105).

When the discharge of the trays 200a to 200c is completed, that is, when the trays 200a to 200c are accommodated in the tray removal area A5, the timer (not illustrated) is actuated (Step S106).

Then, in Step S107, whether time is up or not is determined. If it is determined in Step S107 that time is up, the heating of the IC devices 90 is regarded as sufficient and a notification that the IC devices 90 may be taken out of the tray removal area A5 is given (Step S108).

In this way, according to the inspection device 1, since an electronic component in a low-temperature state is heated by the heating units, the temperature at the time of taking the electronic component out of the electronic component carrying device can be made higher than in the low-temperature state. Therefore, the occurrence of dew condensation in the electronic component can be prevented or restrained.

Second Embodiment

FIG. 7 is a view for explaining a heating unit provided in a second embodiment of the electronic component inspection device of the invention.

Hereinafter, the second embodiment of the electronic component carrying device and the electronic component inspection device of the invention will be described, referring to the illustrations. Differences from the foregoing embodiment will be mainly described and the description of similar matters will be omitted.

This embodiment is similar to the first embodiment except that the configuration of the heating units is different.

As shown in FIG. 7, in an inspection device 1A, a heating unit 4c and a heating unit 4d are made up of a light source which casts light L toward the IC devices 90 placed on the trays 200a to 200c and thus heats the IC devices 90. This light L is not particularly limited, provided that the light can heat the IC devices 90. For example, infrared rays (far-infrared rays) or the like can be used.

With such heating units 4c, 4d, the sending of air can be omitted, as in the first embodiment. Thus, for example, when the IC devices 90 having a small mass are heated, the IC devices 90 can be prevented from being blown away or displaced by wind pressure.

Third Embodiment

FIGS. 8A to 8C are views for explaining a second open/close door provided in a third embodiment of the electronic component inspection device of the invention.

Hereinafter, the third embodiment of the electronic component carrying device and the electronic component inspection device of the invention will be described, referring to the illustrations. Differences from the foregoing embodiment will be mainly described and the description of similar matters will be omitted.

This embodiment is similar to the first embodiment except that the configuration of the second open/close door is different.

As shown in FIGS. 8A to 8C, in an inspection device 1B, the opening 700 of the front cover 70 is provided with a first open/close door 707 and a second open/close door 708. The first open/close door 707 and the second open/close door 708 are provided in such a way as to be slidable on rails (not illustrated) both extending in the X-direction. The first open/close door 707 and the second open/close door 702 are arranged, shifted from each other in the Y-direction. The first open/close door 707 is situated on the front side (negative side on the Y-axis) and the second open/close door 708 is situated on the back side (positive side on the Y-axis).

In a closed state shown in FIG. 8A, the first open/close door 707 closes the opening 700 from the left, and the second open/close door 708 closes the opening 700 from the right. For example, when taking out the tray 200 from this closed state, the first open/close door 707 is moved (slid) to the right and the first open/close door 707 is thus opened, as shown in FIG. 8B. Thus, the tray 200 can be taken out. Particularly, if the first open/close door 707 is opened only by the amount necessary to take out the tray 200, the entry of the outside air into the fourth chamber R4 can be restrained as much as possible.

Meanwhile, for example, when taking out the tray 200c from the closed state shown in FIG. 8A, the second door 708 is moved (slid) to the left and the second door 708 is thus opened, as shown in FIG. 8C. Thus, the tray 200c can be taken out. Particularly, if the second door 708 is opened only by the amount necessary to take out the tray 200c, the entry of the outside air into the fourth chamber R4 can be restrained as much as possible, similarly to the above.

The electronic component carrying device and the electronic component inspection device of the invention have been described above, referring to the illustrated embodiments. However, the invention is not limited to these and each unit forming the electronic component carrying device and the electronic component inspection device can be replaced with a unit having an arbitrary configuration that can achieve similar functions. Also, an arbitrary component may be added.

Also, the electronic component carrying device and the electronic component inspection device of the invention may be a combination of two or more arbitrary configurations (features) of the respective embodiments.

Moreover, though, in each of the embodiments, what are detected and controlled in the second chamber are both temperature and humidity, the invention is not limited to this. Even if it is only one of temperature and humidity, the occurrence of dew condensation in the electronic component can be prevented or restrained.

Also, while two heating units are provided in each of the embodiments, the invention is not limited to this and, for example, one, or three or more may be provided.

The entire disclosure of Japanese Patent Application No. 2015-068261, filed Mar. 30, 2015 is expressly incorporated by reference herein.

The invention claimed is:

1. An electronic component carrying device comprising:
a first chamber in which an electronic component is arranged;
a second chamber in which the electronic component is arranged and which is different from the first chamber; and
a placing unit on which the electronic component is placed so that the electronic component is moved from the first chamber to the second chamber when a controller determines that a predetermined time has passed after the electronic component is placed inside the first chamber,
wherein the second chamber maintains a humidity in a range of 0 to 20% and a temperature in a range of 10 to 35° C.

2. The electronic component carrying device according to claim 1, further comprising:
a first open and close door which is provided between the first chamber and the second chamber and which switches between a circulation state where air circulates between the first chamber and the second chamber and a non-circulation state where the circulation of the air is less than the circulation state.

3. The electronic component carrying device according to claim 2,
wherein the circulation of the air between the first chamber and the second chamber is cut off in the non-circulation state.

4. The electronic component carrying device according to claim 2,
wherein a second open and close door, which is arranged at a different position from the first open and close door and which is configured to perform the circulation of the air between the second chamber and an outside of the electronic component carrying device, is formed in the second chamber.

5. The electronic component carrying device according to claim 4,
wherein the second open and close door opens and closes by swinging or sliding.

6. The electronic component carrying device according to claim 4,
wherein the second open and close door is installed at an opening provided in a wall between the first chamber and the second chamber, and
the second open and close door is configured to adjust a size of the opening.

7. The electronic component carrying device according to claim 4,
wherein the controller controls a period of time during which the second open and close door is open.

8. The electronic component carrying device according to claim 1,
wherein the placing unit is configured with a plurality of the placing units, and
wherein a staying time of the placing unit in the second chamber is measured beginning from a reference time in which all of the plurality of the placing units is placed in the second chamber.

9. The electronic component carrying device according to claim 1,
wherein when at least one of the humidity and the temperature in the second chamber meets a predetermined condition, the semiconductor component on the placing unit is moved from the first chamber to the second chamber.

10. The electronic component carrying device according to claim 1,
wherein an air pressure in the second chamber is equal to or below an air pressure in the first chamber, and
the air pressure in the second chamber is equal to or above an atmospheric pressure.

11. The electronic component carrying device according to claim 1,
wherein a predetermined inspection has been conducted on the electronic component before the electronic component is arranged in the first chamber.

12. An electronic component inspection device comprising:
a first chamber in which an electronic component is arranged;
a second chamber in which the electronic component is arranged and which is different from the first chamber;
a placing unit on which the electronic component is placed so that the electronic component is moved from the first chamber to the second chamber when a controller determines that a predetermined time has passed after the electronic component is placed inside the first chamber; and
an inspection unit which inspects the electronic component,
wherein the second chamber maintains a humidity in a range of 0 to 20% and a temperature in a range of 10 to 35° C.

* * * * *